(12) United States Patent
Hsu et al.

(10) Patent No.: US 10,326,046 B2
(45) Date of Patent: Jun. 18, 2019

(54) GROWTH METHOD OF ALUMINUM GALLIUM NITRIDE

(71) Applicant: EPILEDS TECHNOLOGIES, INC., Tainan (TW)

(72) Inventors: Kung-Hsieh Hsu, Tainan (TW); Ming-Sen Hsu, Tainan (TW)

(73) Assignee: Epileds Technologies, Inc., Tainan (TW)

( * ) Notice: Subject to any disclaimer, the term of this patent is extended or adjusted under 35 U.S.C. 154(b) by 472 days.

(21) Appl. No.: 15/255,429

(22) Filed: Sep. 2, 2016

(65) Prior Publication Data
US 2017/0345967 A1 Nov. 30, 2017

(30) Foreign Application Priority Data
May 30, 2016 (TW) .............................. 105116898 A

(51) Int. Cl.
| | |
|---|---|
| *H01L 21/00* | (2006.01) |
| *H01L 33/02* | (2010.01) |
| *H01L 33/00* | (2010.01) |
| *H01L 33/32* | (2010.01) |
| *C30B 29/40* | (2006.01) |

(52) U.S. Cl.
CPC .......... *H01L 33/025* (2013.01); *C30B 29/406* (2013.01); *H01L 33/007* (2013.01); *H01L 33/0075* (2013.01); *H01L 33/32* (2013.01)

(58) Field of Classification Search
CPC ...... H01L 33/007; H01L 33/025; H01L 33/32
See application file for complete search history.

(56) References Cited

U.S. PATENT DOCUMENTS

| | | | | |
|---|---|---|---|---|
| 2006/0108603 | A1* | 5/2006 | Uemura ................. | B82Y 20/00 257/194 |
| 2009/0014839 | A1* | 1/2009 | Sonobe ................. | H01L 33/007 257/615 |
| 2009/0057688 | A1* | 3/2009 | Hirayama ........... | H01L 21/0242 257/86 |
| 2010/0133508 | A1* | 6/2010 | Bergmann .......... | H01L 21/0237 257/13 |
| 2011/0147771 | A1* | 6/2011 | Moon ................. | H01L 21/0242 257/94 |
| 2015/0041755 | A1* | 2/2015 | Zhang .................... | H01L 33/12 257/13 |
| 2017/0005223 | A1* | 1/2017 | Bergbauer .......... | H01L 31/1852 |

* cited by examiner

*Primary Examiner* — Richard A Booth
(74) *Attorney, Agent, or Firm* — Muncy, Geissler, Olds & Lowe, P.C.

(57) ABSTRACT

A growth method of aluminum gallium nitride is disclosed. The method includes the steps of: providing a substrate; forming a first aluminum gallium nitride layer on the substrate at a first temperature; and forming a second aluminum gallium nitride layer, on the first aluminum gallium nitride layer, at a second temperature. The first temperature is higher than the second temperature.

7 Claims, 8 Drawing Sheets

GROWTH METHOD OF ALUMINUM GALLIUM NITRIDE

CROSS-REFERENCE TO RELATED APPLICATION

This application claims priority from Taiwan Patent Application No. 105116898, filed on May 30, 2016, in Taiwan Intellectual Property Office, the contents of which are hereby incorporated by reference in their entirety for all purposes.

BACKGROUND OF THE INVENTION

1. Field of the Invention

The present invention relates to a growth method of aluminum gallium nitride, and more particularly to a growth method of n-type aluminum gallium nitride with a high aluminum content.

2. Description of the Related Art

FIG. 1 is an enlarged view showing the surface of n-type aluminum gallium nitride ($Al_{0.7}Ga_{0.3}N$) formed at a temperature of 1170° C. FIG. 2 is an enlarged view showing the surface of n-type aluminum gallium nitride ($Al_{0.7}Ga_{0.3}N$) formed at a temperature of 1060° C. As can be seen from FIGS. 1 and 2, when n-type aluminum gallium nitride ($Al_{0.7}Ga_{0.3}N$) is formed at a higher temperature, there are fewer dark spots on its surface. Having a smoother surface improves the luminous efficiency when used in a light-emitting diode. However, experimental data (FIG. 3) shows that forming n-type aluminum gallium nitride at higher temperatures leads to higher values for its sheet resistance. For instance, when n-type aluminum gallium nitride is formed at a temperature of 1170° C., the lowest value of sheet resistance is 180 (ohms/square); and at 1050° C., the lowest value of sheet resistance is 80 (ohms/square). When used in light-emitting diodes, a higher sheet resistance results in greater power consumption. Therefore, finding a way of forming n-type aluminum gallium nitride with fewer dark spots on its surface and with a low sheet resistance is desirable, in order to enhance the luminous efficiency and lower the power consumption when used in a light-emitting diode.

SUMMARY OF THE INVENTION

Given the limitations, just described, of the prior art, the primary objective of the present invention is to provide a growth method of aluminum gallium nitride that reduces the number of dark spot defects present on the surface and also reduces its sheet resistance.

In order to achieve the above objective, the growth method of aluminum gallium nitride of the present invention includes the steps of: providing a substrate; forming a first aluminum gallium nitride layer on the substrate at a first temperature; and forming a second aluminum gallium nitride layer, on the first aluminum gallium nitride layer, at a second temperature. Wherein, the first temperature is higher than the second temperature.

Preferably, the first temperature may be approximately 100° C. higher than the second temperature.

Preferably, the first temperature may be in the range of 1100° C. to 1200° C.

Preferably, the second temperature may be in the range of 1000° C. to 1100° C.

Preferably, the first aluminum gallium nitride layer may be a u-type aluminum gallium nitride layer or an n-type aluminum gallium nitride layer.

Preferably, the second aluminum gallium nitride layer may be an n-type aluminum gallium nitride layer.

Preferably, the n-type aluminum gallium nitride layer may be of composition $Al_yGa_{1-y}N$, wherein which y may be greater than 0.4.

Preferably, y may be equal to 0.7.

Preferably, the substrate may be an aluminum nitride substrate.

Preferably, the step of providing the substrate may include forming an aluminum nitride substrate on an aluminum oxide substrate.

The present invention includes the following advantages:

1. The n-type aluminum gallium nitride layer with high aluminum content formed by the method of the present invention has fewer dark spots on its surface. Thus the luminous efficiency is improved when used in a light-emitting diode.

2. The n-type aluminum gallium nitride layer with high aluminum content formed by the method of the present invention has a lower value of sheet resistance. Thus power consumption is reduced when used in a light-emitting diode.

DESCRIPTION OF THE PREFERRED EMBODIMENTS

Advantages and features of the inventive concept and methods of accomplishing the same may be understood more readily by reference to the following description of embodiments together with the accompanying drawings. These embodiments will be described in detail with reference to the accompanying drawings, in which like reference numbers refer to like elements throughout. The present invention, however, may be embodied in various different forms, and should not be construed as being limited to the illustrated embodiments herein. Rather, these embodiments are provided as examples so that this disclosure will be thorough and complete, and will fully convey the aspects and features of the present invention to those skilled in the art.

One or more exemplary embodiments relate to a growth method of aluminum gallium nitride. The growth method of aluminum gallium nitride disclosed in the following embodiments can reduce the number of dark spot defects present on the surface of aluminum gallium nitride and also lower the value of its sheet resistance.

Figure 1:
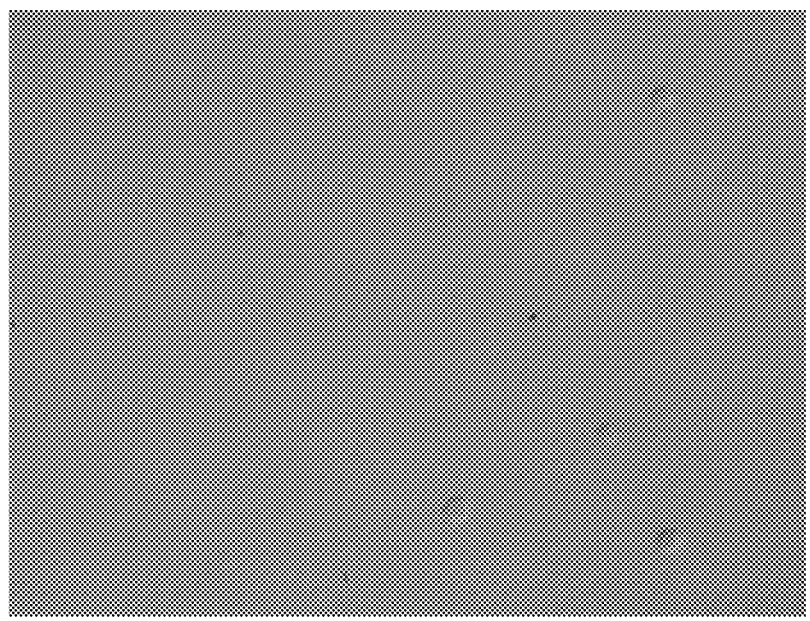
FIG. 1 is a close-up view of the surface of n-type aluminum gallium nitride ($Al_{0.7}Ga_{0.3}N$) formed at a temperature of 1170° C.
Figure 2:
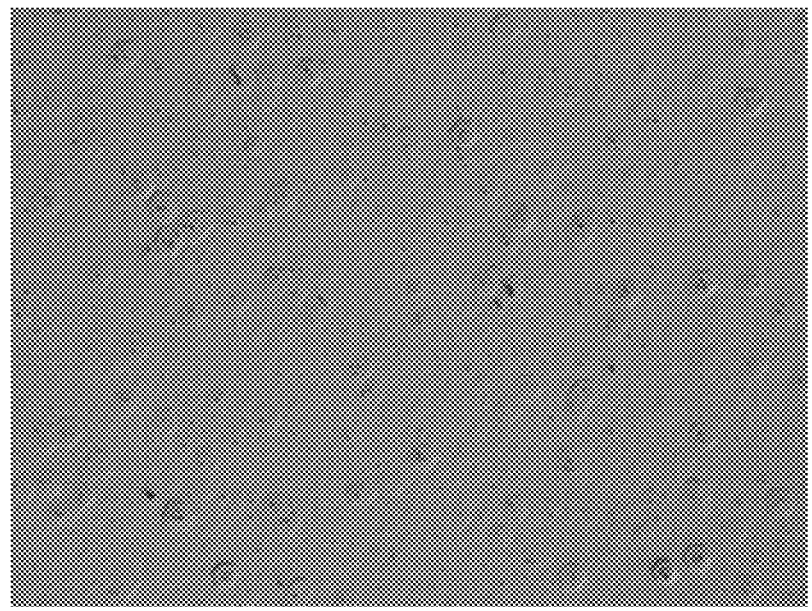
FIG. 2 is a close-up view of the surface of n-type aluminum gallium nitride ($Al_{0.7}Ga_{0.3}N$) formed at a temperature of 1060° C.
Figure 3:
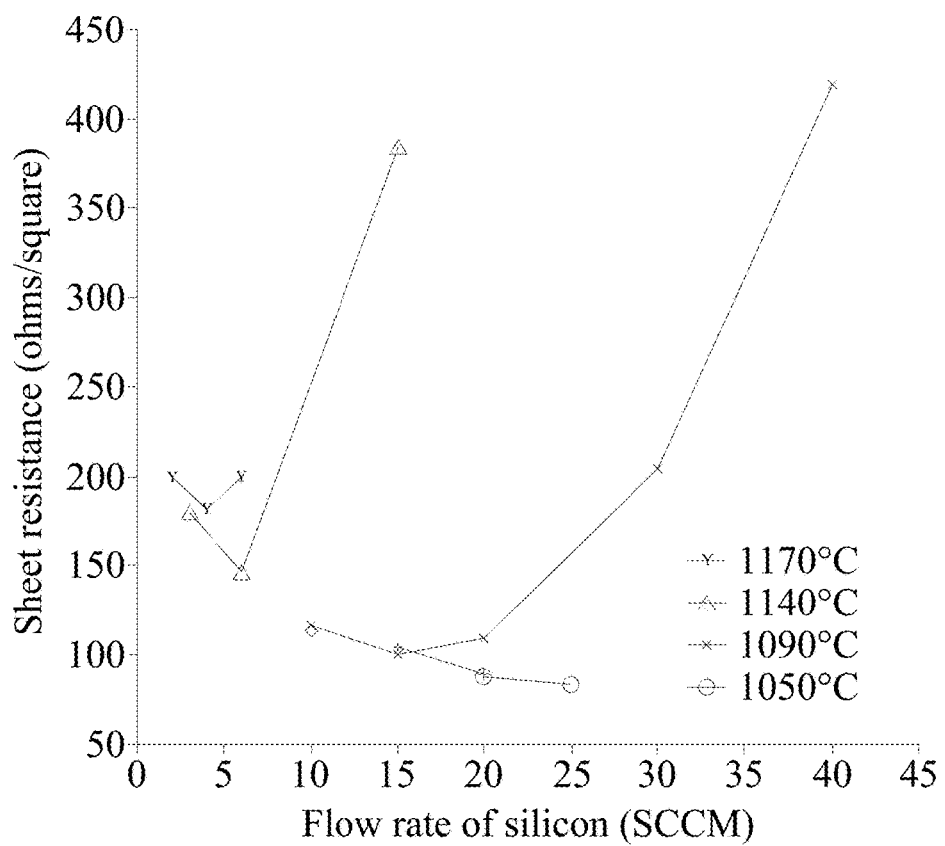
FIG. 3 is a graph showing the relationship between silicon flow rate and sheet resistance, at different temperatures, for the growth of n-type aluminum gallium nitride ($Al_{0.7}Ga_{0.3}N$)
Figure 4:
FIG. 4 is a schematic view illustrating the layers formed following the growth method of aluminum gallium nitride according to the first embodiment of the present invention.
Figure 5:
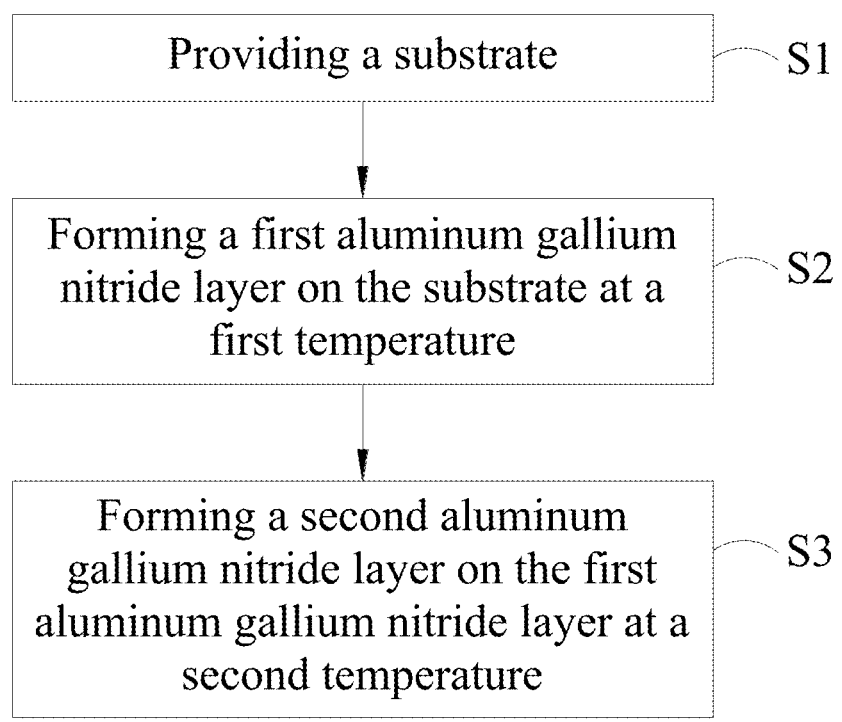
FIG. 5 is a flow chart showing the sequence of steps of the growth method of aluminum gallium nitride according to the first embodiment of the present invention.

A first embodiment of the present invention includes the formation of layers through a growth method of aluminum gallium nitride, wherein the substrate may consist of aluminum nitride (AlN). The schematic view of FIG. 4 illustrates the layers formed and the flow chart of FIG. 5 shows the sequence of steps in the growth method of aluminum gallium nitride according to the first embodiment of the present invention. In this first embodiment, the growth method of aluminum gallium nitride includes, in sequence, the step S1: providing a substrate, wherein the substrate may be an aluminum nitride (AlN) substrate 1B; the step S2: forming a first aluminum gallium nitride layer 3 on the substrate at a first temperature, wherein, for example, in this embodiment the first temperature is around 1170° C.; and the step S3: forming a second aluminum gallium nitride layer 4 on the first aluminum gallium nitride layer 3 at a second temperature, wherein, for example, in this embodiment the second temperature is around 1060° C. Wherein the first and second temperatures of the present invention are not limited to the aforementioned values. Pertinent to the present invention, is that the first temperature is higher than the second temperature. The first aluminum gallium nitride layer 3 is formed on the aluminum nitride substrate 1B at the higher first temperature, and then the second aluminum gallium nitride layer 4 is formed on the first aluminum gallium nitride layer 3 at the lower second temperature to decrease the dark spots existed on the surface of aluminum gallium nitride and to lower the value of sheet resistance of aluminum gallium nitride.

Figure 6:
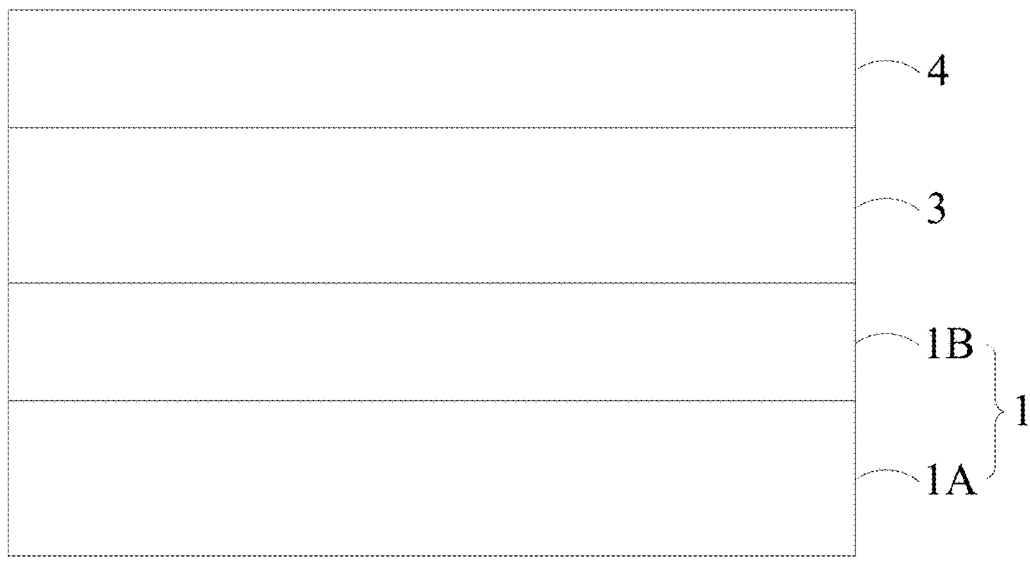
FIG. 6 is a schematic view illustrating the layers formed following the growth method of aluminum gallium nitride according to the second embodiment of the present invention.

A second embodiment of the present invention also includes the formation of layers through a growth method of aluminum gallium nitride, wherein the substrate may consist of an aluminum oxide substrate and an aluminum nitride substrate. The schematic view of FIG. 6 illustrates the layers formed in the growth method of aluminum gallium nitride according to the second embodiment of the present invention. In this second embodiment, the substrate 1 is an aluminum nitride (AlN) template substrate composed of an aluminum oxide substrate 1A and an aluminum nitride substrate 1B formed on the aluminum oxide substrate 1A. Then, the first aluminum gallium nitride layer 3 of the present invention may be formed on the aluminum nitride substrate 1B or the AlN template substrate 1 at the first temperature, for example at around 1170° C. After that, the second aluminum gallium nitride layer 4 is formed on the first aluminum gallium nitride layer 3 at the second temperature, for example at around 1060° C. Wherein the first and second temperatures of the present invention are not limited to the aforementioned values. Pertinent to the present invention, as in the first embodiment, is that the first temperature is around 100° C. higher than the second temperature. Similar to the first embodiment, the first aluminum gallium nitride layer 3 is first formed on the aluminum nitride substrate 1B or the AlN template substrate 1 at the higher first temperature, and then the second aluminum gallium nitride layer 4 is formed on the first aluminum gallium nitride layer 3 at the lower second temperature, to form an aluminum gallium nitride layer with fewer dark spots on its surface and with a lower value of sheet resistance.

Figure 7:
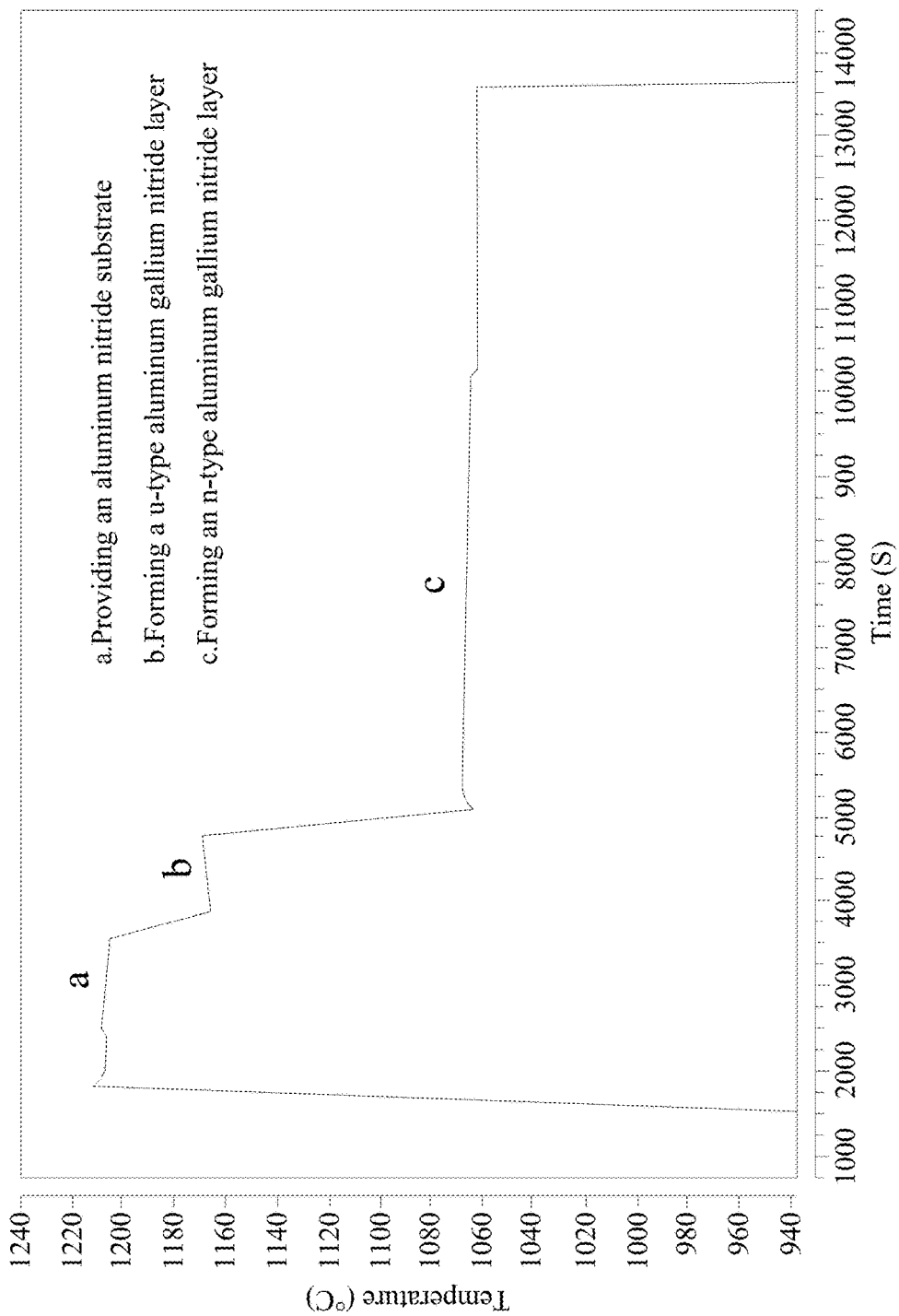
FIG. 7 is a graph showing the progression in time of the temperature in the growth of aluminum gallium nitride according to the third embodiment of the present invention.
Figure 8:
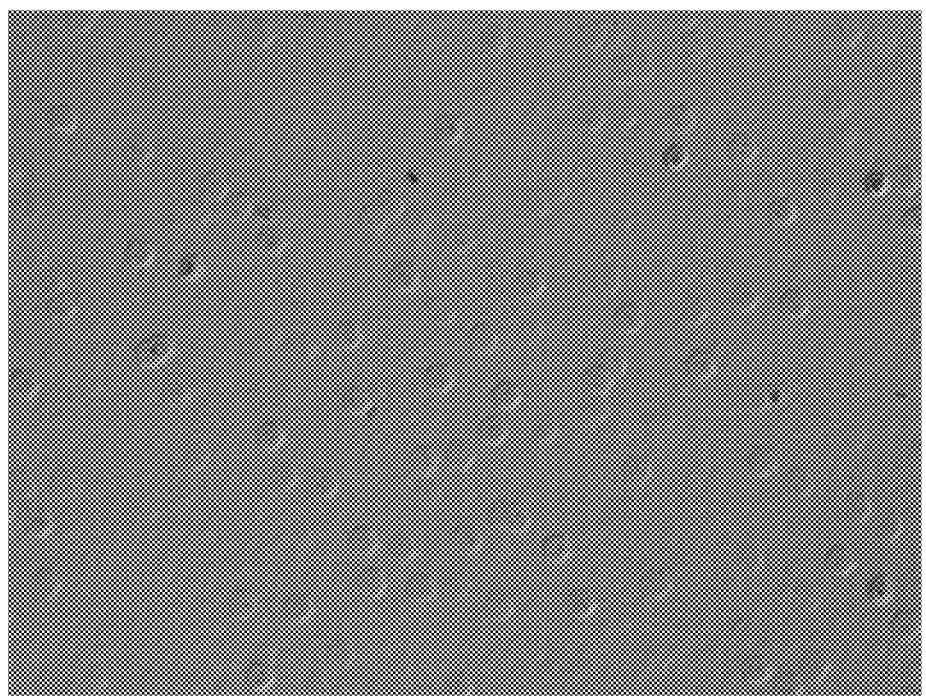
FIG. 8 is a close-up view of the surface of aluminum gallium nitride according to the third embodiment of the present invention.

A third embodiment of the present invention includes the formation of layers through a growth method of aluminum gallium nitride, wherein the first aluminum gallium nitride layer may consist of u-type or n-type aluminum gallium nitride and the second aluminum gallium nitride layer may consist of n-type aluminum gallium nitride with the composition $Al_{0.7}Ga_{0.3}N$. The graph of FIG. 7 shows the progression in time of the temperature in the growth of aluminum gallium nitride according to the third embodiment of the present invention. In this third embodiment, firstly an AlN substrate 1B is provided, then the first aluminum gallium nitride layer 3 is formed on the AlN substrate 1B at the first temperature of about 1170° C. Where the first aluminum gallium nitride layer 3 of this embodiment consists of u-type aluminum gallium nitride, or may consist of n-type aluminum gallium nitride. And then, finally, the second aluminum gallium nitride layer 4 is formed on the u-type aluminum gallium nitride layer at the second temperature of around 1060° C. Where the second aluminum gallium nitride layer 4 of this embodiment consists of n-type aluminum gallium nitride of composition $Al_yGa_{1-y}N$, with the value of y being 0.7. The present invention is, however, not limited thereto; indeed a value greater than 0.4 for y is pertinent to the present invention. And, as in prior embodiments, the first and the second temperatures of the present invention are also not limited to the aforementioned values. Pertinent to the present invention are a first temperature in the range of 1100° C. to 1200° C. and a second temperature in the range of 1000° C. to 1100° C. This results in fewer dark spots on the surface (as shown in FIG. 8) and a lower value of sheet resistance of the n-type aluminum gallium nitride layer with high aluminum content. Consequently, light-emitting diodes manufactured with the method of the present invention will have higher luminous efficiency and lower power consumption.

In summary, a u- or n-type aluminum gallium nitride layer is first formed at a relatively high temperature, and then an n-type aluminum gallium nitride layer is formed at a relatively low temperature to form an n-type aluminum gallium nitride layer with fewer dark spots on its surface and with a lower value of sheet resistance. Thus, light-emitting diodes manufactured with the method of the present invention will have higher luminous efficiency and lower power consumption.

Although particular embodiments have been described in detail for the purpose of illustrating the present invention, various modifications and enhancements may be made without departing from the spirit and scope of the present invention. Accordingly, the present invention is not to be limited, except as by the appended claims.

What is claimed is:

1. A growth method of aluminum gallium nitride, comprising the steps of:
   providing a substrate;
   forming a AlN layer on the substrate;
   forming a first aluminum gallium nitride layer in contact with the AlN layer at a first temperature; and
   forming a second aluminum gallium nitride layer on the first aluminum gallium nitride layer at a second temperature;
   wherein the first temperature is higher than the second temperature, and the first aluminum gallium nitride layer and the second aluminum gallium nitride layer are both n-type aluminum gallium nitride layers.

2. The method as claimed in claim 1, wherein the first temperature is approximately 100° C. higher than the second temperature.

3. The method as claimed in claim 1, wherein the first temperature is in the range of 1100° C. to 1200° C.

4. The method as claimed in claim 1, wherein the second temperature is in the range of 1000° C. to 1100° C.

5. The method as claimed in claim 1, wherein the n-type aluminum gallium nitride layer is of composition $Al_yGa_{1-y}N$, wherein which y is greater than 0.4.

6. The method as claimed in claim 5, wherein y is equal to 0.7.

7. The method as claimed in claim 1, wherein the substrate is an aluminum nitride substrate.

* * * * *